United States Patent
Swenburg et al.

(10) Patent No.: US 8,163,626 B2
(45) Date of Patent: *Apr. 24, 2012

(54) ENHANCING NAND FLASH FLOATING GATE PERFORMANCE

(75) Inventors: Johanes Swenburg, Los Gatos, CA (US); David Chu, Campbell, CA (US); Theresa Kramer Guarini, San Jose, CA (US); Yonah Cho, Sunnyvale, CA (US); Udayan Ganguly, San Jose, CA (US); Lucien Date, Ottignies-Louvain-La-Neuve (BE)

(73) Assignee: Applied Materials, Inc., Santa Clara, CA (US)

(*) Notice: Subject to any disclaimer, the term of this patent is extended or adjusted under 35 U.S.C. 154(b) by 39 days.

This patent is subject to a terminal disclaimer.

(21) Appl. No.: 12/815,659

(22) Filed: Jun. 15, 2010

(65) Prior Publication Data

US 2010/0317186 A1 Dec. 16, 2010

Related U.S. Application Data

(60) Provisional application No. 61/187,208, filed on Jun. 15, 2009.

(51) Int. Cl.
*H01L 21/76* (2006.01)

(52) U.S. Cl. ......... 438/431; 257/E21.079; 257/E21.267; 257/E21.301; 438/770; 438/911

(58) Field of Classification Search ........... 257/E21.079, 257/E21.267, E21.301; 438/431, 770, 911
See application file for complete search history.

(56) References Cited

U.S. PATENT DOCUMENTS

| 7,972,933 B2 * | 7/2011 | Olsen et al. ................. 438/431 |
| 2005/0266637 A1 | 12/2005 | Wang |
| 2007/0207627 A1 * | 9/2007 | Dong et al. .................. 438/769 |
| 2008/0014729 A1 | 1/2008 | Lee et al. |
| 2008/0090354 A1 | 4/2008 | Baek et al. |
| 2008/0132086 A1 | 6/2008 | Dong et al. |
| 2009/0011609 A1 | 1/2009 | Ramkumar et al. |
| 2009/0035952 A1 | 2/2009 | Chua et al. |
| 2009/0081884 A1 | 3/2009 | Yokota et al. |
| 2010/0062603 A1 | 3/2010 | Ganguly et al. |
| 2010/0248435 A1 | 9/2010 | Olsen et al. |

OTHER PUBLICATIONS

Ching Yuan Ho, et al.; Improvement of Interpoly Dielectric Characteristics by Plasma Nitridation and Oxidation for Future NAND Flash Memory; IEEE Electron Device Letters, vol. 29, No. 11, Nov. 2008, pp. 1199-1202.
International Search Report and Written Opinion of the International Searching Authority mailed Jan. 20, 2011 in PCT/US10/038604 (APPM/014477PCT).

* cited by examiner

*Primary Examiner* — Asok Sarkar
(74) *Attorney, Agent, or Firm* — Patterson & Sheridan, LLP

(57) ABSTRACT

Embodiments described herein generally relate to flash memory devices and methods for manufacturing flash memory devices. In one embodiment, a method for selective removal of nitrogen from the nitrided areas of a substrate is provided. The method comprises positioning a substrate comprising a material layer disposed adjacent to an oxide containing layer in a processing chamber, exposing the substrate to a nitridation process to incorporate nitrogen onto the material layer and the exposed areas of the oxide containing layer, and exposing the nitrided material layer and the nitrided areas of the oxide containing layer to a gas mixture comprising a quantity of a hydrogen containing gas and a quantity of an oxygen containing gas to selectively remove nitrogen from the nitrided areas of the oxide containing layer relative to the nitrided material layer using a radical oxidation process.

20 Claims, 7 Drawing Sheets

ENHANCING NAND FLASH FLOATING GATE PERFORMANCE

CROSS-REFERENCE TO RELATED APPLICATIONS

This application claims benefit of U.S. provisional patent application Ser. No. 61/187,208, filed Jun. 15, 2009, which is herein incorporated by reference in its entirety.

BACKGROUND

1. Field

Embodiments described herein generally relate to the field of semiconductor manufacturing processes and devices. More particularly, the embodiments described herein are related to the selective removal of nitrogen from the nitrided areas of a substrate.

2. Description of the Related Art

As semiconductor devices continue to scale down according to Moore's Law, processing challenges develop. One such challenge arises in floating gate (FG) NAND flash memory chips, which feature transistors that incorporate two gate elements, a control gate (CG) and a floating gate (FG), to enable each transistor to assume more than one bit value. FG NAND memory forms the basis of most USB flash memory devices and memory card formats used today.

As critical dimensions of FG NAND devices shrink, the geometry of the various components becomes more challenging for manufacturers. Aspect ratios rise and uniformity, tolerance, and reliability issues proliferate. With NAND flash memory increasing in popularity as a convenient storage medium, there is a need for improved manufacturing processes to overcome scaling challenges particular to NAND flash devices.

The NAND flash floating gate (FG) memory cell is comprised of a thick tunnel oxide (TO), a polysilicon FG, an inter-poly dielectric (IPD) and a control gate (CG). The poly FG is isolated from the channel by the TO and from the CG by the IPD. A program/erase (P/E) operation is used to set the memory state of the device. During the program operation a positive voltage is applied to the CG, injecting electrons from the channel into the FG. The stored electrons shift the threshold voltage ($V_t$) of the transistor, indicating the "0" state. During the erase operation a negative voltage is applied to the CG to expel the stored electrons from the floating gate into the channel, resetting the $V_t$ to the "1" state.

The difference between the program $V_t$ and erase $V_t$ is referred to as the memory window and is a key device parameter defining the range of operation. At all other times, the memory cell is in retention mode, where the cell terminals are grounded. The FG should retain the stored charge for at least 10 years. However, charge loss can occur when electrons leak through defects in the dielectric films (either TO or IPD) surrounding the FG, causing a $V_t$ shift that will eventually compromise the identification (read-out) of the memory state. Therefore, retention of the FG charge is a key requirement for reliable operation.

Meeting device reliability requirements becomes more difficult with the physical scaling of the FG array. At each technology node, the number of electrons stored in the FG decreases from, for example, approximately 1,000 electrons at the 90 nm node to ~100 electrons at the 30 nm node. Therefore, the impact on $V_t$ for each electron lost from the FG will be much greater at 30 nm than at 90 nm. One consequence of this has been that the TO thickness has not been reduced with device scaling and has even increased in thickness slightly to improve charge retention.

Another challenge is the scaling of the IPD film stack thickness—typically from 150 Å at the 50 nm node to 125 Å at the 30 nm node. This results in a corresponding reduction in equivalent oxide thickness (EOT), or capacitance, a change that is required to maintain good electrical coupling between the CG and FG. However, as the thickness of the IPD stack is reduced, leakage from the FG is more likely to occur. Hence, improvements in the IPD electrical properties are essential to limit leakage with continued scaling.

To enable continued physical and electrical scaling of the flash device, nitridation techniques such as plasma nitridation can be used to improve the properties of the TO, bottom IPD, and top IPD layers of a floating gate memory cell structure. However, nitridation processes are often difficult to control leading to incorporation of nitrogen in unwanted areas.

Thus, there is a need for improved methods for nitridation of stacks of materials.

SUMMARY

Embodiments described herein generally relate to the field of semiconductor manufacturing processes and devices. More particularly, the embodiments described herein are related to the selective removal of nitrogen from the nitrided areas of a substrate. In one embodiment, a method for selective removal of nitrogen from the nitrided areas of a substrate is provided. The method comprises positioning a substrate comprising a material layer disposed adjacent to an oxide containing layer in a processing chamber, exposing the substrate to a nitridation process to incorporate nitrogen onto the material layer and the exposed areas of the oxide containing layer, and exposing the nitrided material layer and the nitrided areas of the oxide containing layer to a gas mixture comprising a quantity of a hydrogen containing gas and a quantity of an oxygen containing gas to selectively remove nitrogen from the nitrided areas of the oxide containing layer relative to the nitrided material layer using a radical oxidation process.

In another embodiment, a method for the selective removal of nitrogen from the nitrided areas of a substrate is provided. The method comprises positioning a substrate comprising a polysilicon floating gate disposed on a tunnel oxide and a shallow trench isolation region disposed adjacent to the tunnel oxide layer in a processing region, exposing the substrate to a nitridation process to incorporate nitrogen onto the polysilicon floating gate and the exposed areas of the shallow trench isolation region, and exposing the nitrided polysilicon floating gate and the nitrided areas of the shallow trench isolation region to a process gas comprising a quantity of a hydrogen containing gas and a quantity of an oxygen containing gas to selectively remove nitrogen from the nitrided areas of the shallow trench isolation region relative to the nitrided material layer using a radical oxidation process.

In yet another embodiment, a method for forming a floating gate memory cell is provided. The method comprises exposing a substrate comprising a floating gate disposed adjacent to a shallow trench isolation region to a plasma nitridation process and exposing the substrate to a radical oxidation process to remove nitrogen from the shallow trench isolation region without affecting the nitrogen in the floating gate.

In yet another embodiment, a method for selective removal of nitrogen from the nitrided areas of a substrate is provided. The method comprises exposing a nitrided material layer and nitrided areas of an oxide containing layer to a gas mixture comprising a quantity of a hydrogen containing gas and a quantity of an oxygen containing gas to selectively remove nitrogen from the nitrided areas of the oxide containing layer relative to the nitrided material layer using a radical oxidation process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
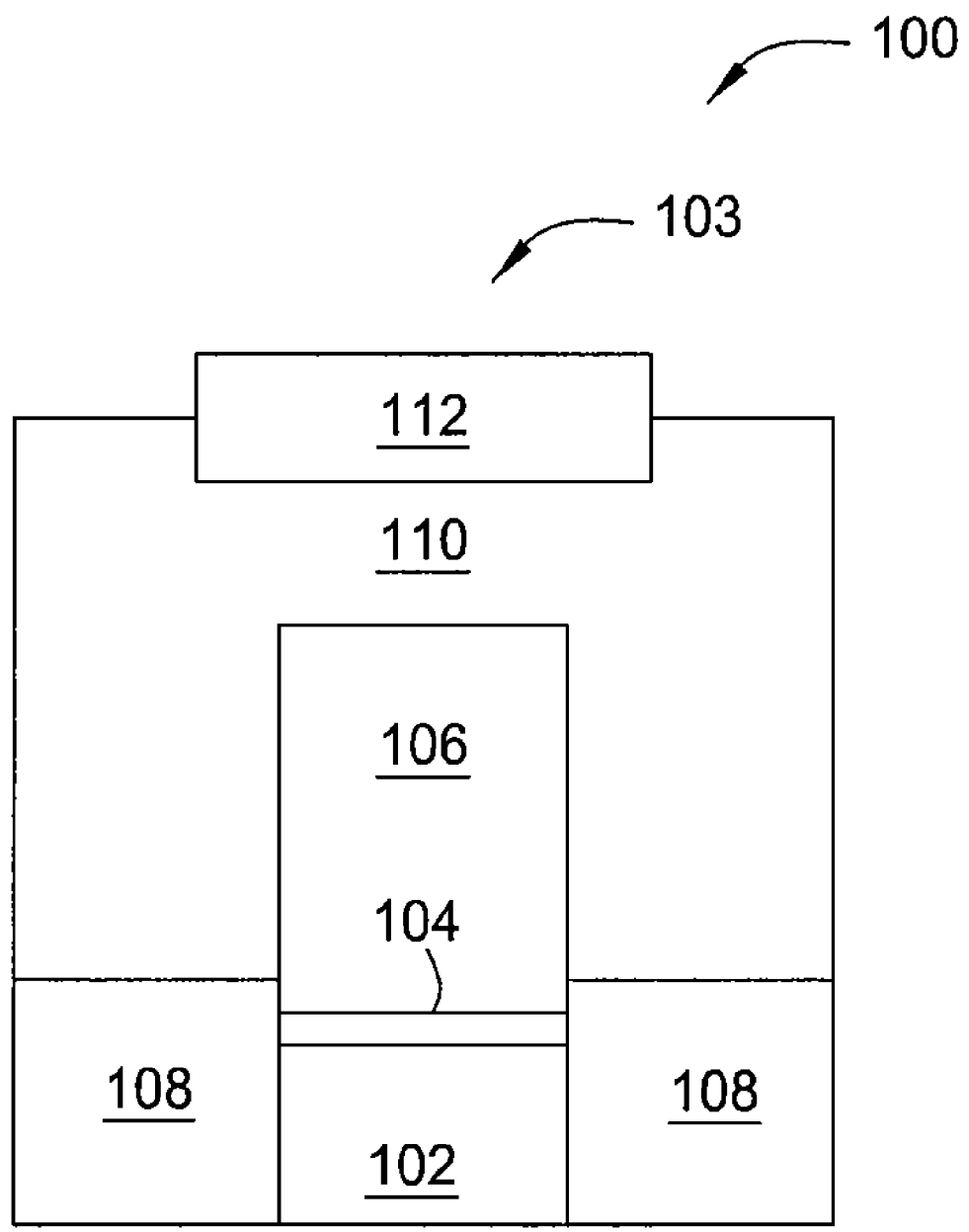
FIG. 1 is a floating gate memory cell structure formed according to embodiments of the present invention.

Embodiments described herein generally relate to the field of semiconductor manufacturing processes and devices. More particularly, the embodiments described herein are related to the selective removal of nitrogen from the nitrided areas of a substrate. Embodiments described herein further provide methods for "selectively nitriding" a substrate by the selective removal of nitrogen from a material layer after a nitridation process without affecting the nitrogen deposited in an oxide containing layer by exposing the material layer to a radical oxidation process. The methods described herein may be used in the production of semiconductor devices, for example, NAND or NOR flash memory, or other suitable devices where selective nitridation of the device is desirable.

The FG polysilicon is typically doped with phosphorus or boron to provide a conducting film. During subsequent high temperature processing in forming the IPD stack, the dopant can diffuse out from the FG polysilicon surface. Loss of the dopant such as phosphorous results in depletion of the polysilicon at the polysilicon/IPD interface; this creates a thin insulating poly film and increases the overall EOT of the IPD stack. Suppressing phosphorous out-diffusion is thereby equivalent to reducing the IPD equivalent oxide thickness (EOT). Nitrogen on the polysilicon surface serves as a diffusion barrier to prevent phosphorous out-diffusion from the polysilicon during subsequent high temperature IPD deposition.

Nitridation of the poly is easily accomplished via a nitridation process, such as a plasma nitridation (DPN) process or a thermal nitridation process. However, during this process nitrogen is also incorporated into the adjacent shallow trench isolation (STI) oxide film. Unfortunately, nitrogen incorporated in the STI oxide between neighboring FG cells can provide a charge leakage path. The degree of charge sharing will depend on the amount of nitrogen incorporated in the STI and this will set an upper limit on the bottom IPD nitridation process achievable on the FG poly.

Selectivity is defined as the amount of nitrogen incorporated in FG poly Si compared to nitrogen incorporation in the STI (oxide) region. The higher (greater) selectivity means a higher ratio of nitrogen in the FG polysilicon to nitrogen in the STI. There are at least 2 approaches of increasing the selectivity of nitridation. One approach is a single step nitridation process with optimized process and hardware optimization. In another approach, as described herein, a two step process combining a nitridation step and an additional radical oxidation step to selectively remove nitrogen from the STI regions after the nitridation process without affecting the nitrogen in the FG polysilicon is provided. In certain embodiments, the overall selectivity of the selective removal of nitrogen can be >2, >10, >100, or >1,000. In certain embodiments, steam oxidation or oxidation by the use of water vapor may be used.

The methods described herein, for example, such as nitridation and radical oxidation processes may be performed in a single substrate processing chamber configured to provide the respective process gases, plasmas, and the like, necessary to perform the processes discussed above. Alternatively, the methods described herein, for example, such as nitridation and radical oxidation processes may be performed in individual nitridation and oxidation chambers. In certain embodiments the individual nitridation and oxidation chambers may be coupled to, or part of, an integrated processing tool, such as a cluster tool. Examples of the integrated tools include the CENTURA® and ENDURA® integrated tools, both available from Applied Materials, Inc., of Santa Clara, Calif. It is contemplated that the methods described herein may be practiced using other processing chamber and cluster tools having suitable process chambers coupled thereto. Portions of the methods described herein may be performed in any suitable chamber configured for radical oxidation, also know as in-situ steam generation (ISSG), or the like. Suitable oxidation chambers may include, but are not limited to, RADIANCE®, Plasma Immersion Ion Implantation (P3I), VANTAGE® RADOX™, VANTAGE® RADIANCE® Plus, CENTURA® RADOX™ chambers available from Applied Materials, Inc. of Santa Clara, Calif. Suitable nitridation chambers may include, but are not limited to, DPN, DPN Plus, DPN3 chambers available from Applied Materials, Inc. of Santa Clara, Calif. Exemplary radical oxidation processes may be performed with various oxidative chemistries include varying reducing gas concentration for reducing gases, such as one or more of hydrogen ($H_2$), ammonia ($NH_3$) or the like within an oxidative gas mixture include oxidative gases, such as one or more of oxygen ($O_2$), nitric oxide (NO), nitrous oxide ($N_2O$) or the like, and optionally including nonreactive gases, such as one or more of nitrogen gas ($N_2$), helium (He), argon (Ar), neon (Ne), and xenon (Xe). One form of radical oxidation is performed using $H_2$ and $O_2$ only.

FIG. 1 is a floating gate memory cell device 100 formed according to embodiments described herein. The memory device 100 includes a substrate 102 having a tunnel oxide layer 104 disposed thereon. A floating gate 106 is disposed on the tunnel oxide layer 104. The floating gate 106, the tunnel oxide layer 104, and the underlying portion of the substrate 102 may comprise a cell 103 (or memory unit) of the memory device 100. Each cell of the memory device may be separated from adjacent cells. For example, in the memory device 100, a shallow trench isolation (STI) region 108 is disposed in the substrate 102 between each cell (for example, adjacent to the tunnel oxide layer 104 and the floating gate 106, where the STI region 108 separates the cell 103 from adjacent cells (not shown)). The memory device 100 further includes an inter-poly dielectric (IPD) layer 110 disposed above the floating gate 106 and a control gate layer 112. The IPD layer 110 separates the floating gate 106 from the control gate layer 112.

The substrate 102 may comprise a suitable material such as crystalline silicon (for example, Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In certain embodiments, the substrate 102 comprises silicon.

The tunnel oxide layer 104 may comprise silicon and oxygen, such as silicon oxide ($SiO_2$), silicon oxynitride (SiON), or high-k dielectric materials, such as aluminum- (Al), hafnium- (Hf), or lanthanum- (La), zirconium- (Zr) based oxides or oxynitrides, or silicon nitrides ($Si_xN_y$), in single or layered structures (for example, $SiO_2$/high-k/$SiO_2$), or the like. The tunnel oxide layer 104 may have any suitable thickness, for example, between about 5 to about 12 nm. The tunnel oxide layer 104 may have a width, within each cell, substantially equivalent to the width of a base of the floating gate 106. The STI region 108 may comprise silicon and oxygen, such as silicon oxide ($SiO_2$), silicon oxynitride (SiON), or the like.

The floating gate 106 typically comprises a material layer which comprises a conductive material, such as polysilicon, metals, or the like. The floating gate 106 has a configuration suitable to facilitate disposing portions of the control gate layer 112 between adjacent cells. In certain embodiments, the height of the floating gate 106 may be between about 20 to about 100 nm.

The IPD layer 110 may comprise any suitable single or multi-layer dielectric material. A single layer IPD may comprise $SiO_2$, SiON, a high-k dielectric material as discussed above with respect to tunnel oxide layer 104, or the like. A non-limiting example of a multi-layer IPD is a multi-layer ONO layer comprising a first oxide layer, a nitride layer, and a second oxide layer. The first and second oxide layers typically comprise silicon and oxygen, such as silicon oxide ($SiO_2$), silicon oxynitride (SiON), or the like. The nitride layer typically comprises silicon and nitrogen, such as silicon nitride (SiN), or the like. In certain embodiments, a multi-layer IPD layer comprising $SiO_2$/high-k/$SiO_2$ (such as, $SiO_2$/$Al_2O_3$/$SiO_2$) can also be used as the IPD layer 110. In certain embodiments, the IPD layer 110 is deposited to a thickness of between about 12 to about 15 nm.

The control gate layer 112 may be deposited atop the IPD layer 110 to form a control gate. The control gate layer 112 typically comprises a conductive material, such as polysilicon, metal, or the like.

Figure 2:
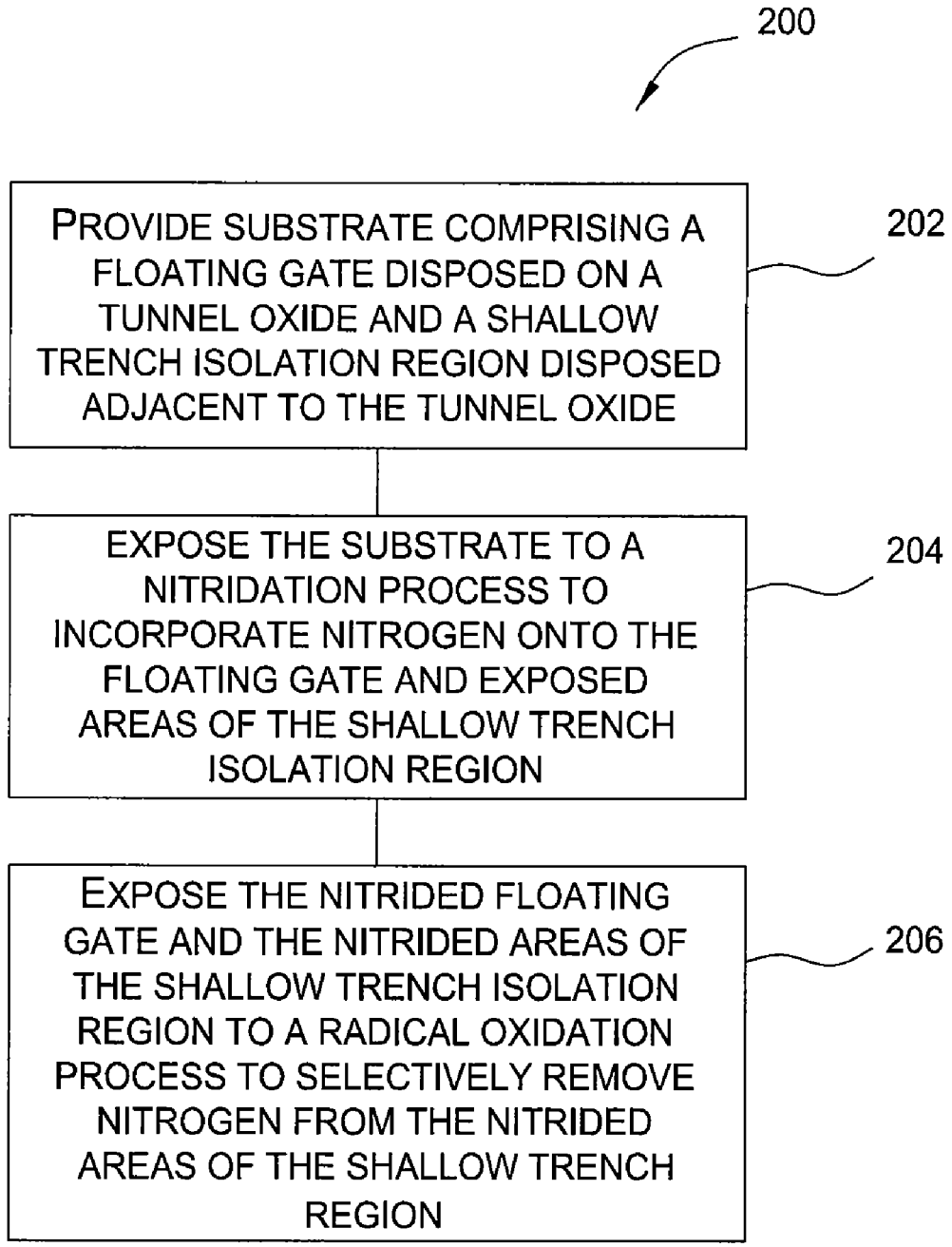
FIG. 2 is a flowchart that illustrates one embodiment of the present invention.

FIG. 2 depicts a method 200 of fabricating a semiconductor device having a floating gate in accordance with the selective nitrogen removal techniques described herein. The method 200 is illustratively described with reference to FIGS. 3A-C, which depicts stages of fabrication of a memory device 300 in accordance with the embodiments of the method 200. The method 200 includes the incorporation of nitrogen on silicon and silicon oxide surfaces followed by a radical oxidation process to selectively remove nitrogen from the silicon oxide surfaces while nitrogen remains on the silicon surfaces.

Figure 3A:
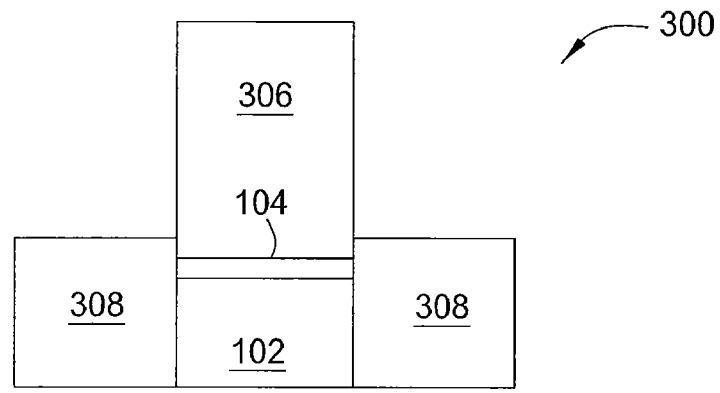
FIG. 3A-3C depict stages of fabrication of a memory cell structure according to embodiments of the present invention.

The method 200 generally begins at 202, where a substrate having a material layer to be formed into a floating gate may be provided to a processing region of a processing chamber. In one embodiment, the material layer is a silicon layer. For example, as shown in FIG. 3A, the substrate 102 and floating gate 306 (similar to floating gate 106) may be part of a partially fabricated memory device 300. The memory device 300 may comprise the substrate 102 having the tunnel oxide layer 104 disposed thereon. The floating gate 306 may be deposited atop the tunnel oxide layer 104. A shallow trench isolation (STI) region 308 (similar to STI region 108) may be disposed adjacent to the tunnel oxide layer 104 and the floating gate 306. Other fabrication steps to provide the substrate and partially fabricated memory device 300 performed prior to beginning the method 200 include deposition of an isolation material, such as $SiO_2$, in the STI region 308, planarizing the isolation material level with an upper surface of the floating gate 306, and etching the isolation material down to a desired level to result in a substrate having the floating gate 306 disposed thereon.

Figure 3B:
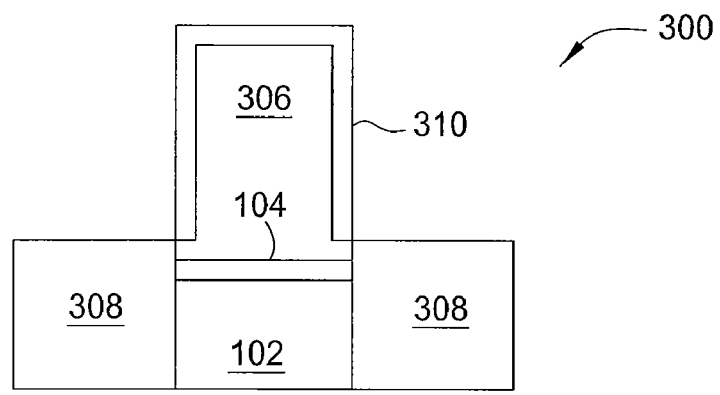

At 204, the partially fabricated memory device 300 is exposed to a nitridation process to form a nitride layer 310 on the exposed surfaces of the floating gate 306 and the STI region 308 as illustrated in FIG. 3B. The nitride layer 310 may be formed using any suitable nitridation process known in the art, for example, a plasma nitridation process or a thermal nitridation process (e.g., NO, $N_2O$, or $NH_3$ anneals). In certain embodiments, the plasma nitridation process is a decoupled plasma nitridation process. In certain embodiments, the nitridation process comprises a "soft" plasma with low ion energy and low electron temperatures achieved by pulsing the RF power supply. The nitride layer 310 may comprise silicon nitride (SiN), silicon oxynitride (SiON), or both. In certain embodiments, the nitridation process is a non-directional nitridation process. The nitride layer 310 may be formed to a greater thickness on the horizontal surfaces of the floating gate 306 and STI region 308. In certain embodiments, the nitride layer 310 has a thickness between about 0.1 nm and about 5 nm.

Figure 3C:
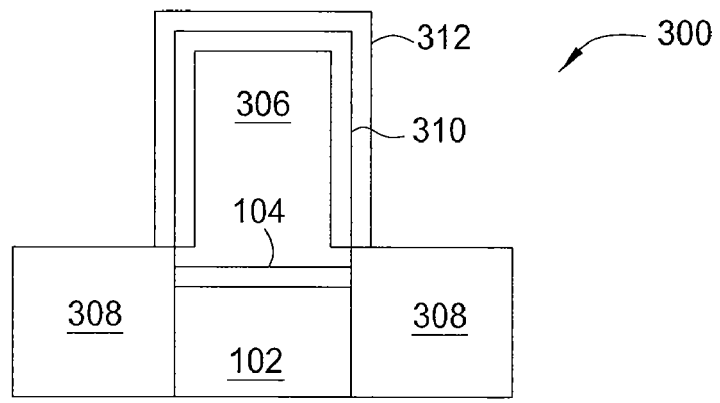

At 206, the nitride layer 310, the floating gate 306, and the STI region 308 are radically oxidized to remove the portions of the nitride layer 310 formed over the horizontal surfaces of the STI region 308 while forming an oxide layer 312 over the portion of the nitride layer 310 remaining over the floating gate 306. In certain embodiments, the oxide layer 312 has a thickness between about 0.1 nm and about 10 nm. The radical oxidation process is performed using both oxygen containing gases and hydrogen containing gases. Initially, as depicted in FIG. 3C, the radical oxidation process facilitates the formation of the oxide layer 312, for example, a silicon oxynitride (SiON) layer over the portion of the nitride layer 310 formed over the floating gate 306 while the portion of the nitride layer 310 overlying the STI region 308 is removed during the radical oxidation process to expose the surface of the STI region 308.

As discussed above, the radical oxidation process is performed in the presence of both oxygen containing gases and hydrogen containing gases. The oxygen containing gases and hydrogen containing gases may be introduced separately into the processing chamber or may be combined to form a process gas prior to introduction into the processing chamber. In certain embodiments, the partially fabricated memory device 300 may be positioned in a processing region of a process chamber under a non-reactive atmosphere and subjected to a temperature and pressure ramp-up process. Gases which are considered non-reactive include, but are not limited to, nitrogen gas ($N_2$), helium (He), argon (Ar), neon (Ne), and xenon (Xe). The oxygen containing gas may be fed into the process chamber prior to and/or during the ramping-up of temperature and pressure. Alternately, the non-reactive atmosphere may be maintained during the ramp-up by flowing non-reactive gas into and out of the process chamber. Pressure in the chamber may be precisely controlled. Temperature and pressure may be ramped in any pattern, simultaneously or consecutively, up to the desired predetermined process conditions. It has been found that the most favorable radical oxidation conditions are obtained at pressures less than 50 Torr, for example, between about 0.1 Torr and 50 Torr, between about 2 Torr to about 20 Torr, especially between about 5 Torr to 10 Torr, such as about 8 Torr. It has also been found that the most favorable radical oxidation conditions are achieved at substrate temperatures between about 500° C. and about 1,200° C., for example, between about 650° C. and about 1,050° C. such as about 700° C.

The hydrogen containing gas may be fed to the process chamber during the ramping-up of temperature and pressure or flowed after a set temperature is reached for better process control. In certain embodiments, the set temperature includes the substrate temperatures described above. Although hydrogen ($H_2$) gas is preferred, other gases, such as ammonia ($NH_3$) may be used. In certain embodiments, when the desired flow rate of oxygen containing gas is reached, and operating conditions established, a hydrogen containing gas is fed into the process chamber to create a gas mixture. Although oxygen ($O_2$) gas is preferred, other oxidizing gases, such as nitrous oxide ($N_2O$) may be used. The flow rate of the oxygen containing gas is ramped up to a set point to allow temperature, pressure, and flow controls to respond as the reaction begins. In certain embodiments, the hydrogen containing gas and the oxygen containing gas are introduced into the process region with the heated substrate and under such conditions, oxygen and hydroxide radicals are generated on the heated substrate.

It is thought that hydroxide radicals and oxygen radicals diffuse into the silicon oxide containing material crystal network, liberating nitrogen from the silicon oxide regions. Processing continues until a predetermined end point is reached, such as a certain amount of time or until nitrogen is removed from the silicon oxide region to expose a surface of the silicon oxide region. The temperature is reduced and the chamber evacuated to remove reactive species. A non-reactive gas may be once again delivered to the chamber to complete the process, after which the substrate is removed from the chamber.

In certain embodiments, it may be desirable to deliver the oxygen containing gas to the chamber prior to introduction of the hydrogen containing gas. In certain embodiments, the hydrogen containing gas and the oxygen containing gas may both be ramped up together. In other embodiments, a non-reactive or carrier gas may be used with the hydrogen containing gas or the oxygen containing gas, or both, and may be fed separately or with either gas. The hydrogen containing and oxygen containing gases may be pre-mixed outside the reaction chamber or fed individually to the chamber.

In certain embodiments, where the process gas (or gas mixture) includes oxygen ($O_2$) and hydrogen ($H_2$) the hydrogen ($H_2$) will comprise at least 0.5 percent, 3 percent, 10 percent, 20 percent, 30 percent, 40 percent, 50 percent, 60 percent or 70 percent of the total amount of oxygen ($O_2$) and hydrogen ($H_2$) provided. In certain embodiments, the process gas (or gas mixture) will comprise up to 5 percent, 10 percent, 20 percent, 30 percent, 40 percent, 50 percent, 60 percent, 70 percent, 80 percent, or up to 95 percent hydrogen of the total amount of oxygen ($O_2$) and hydrogen ($H_2$) provided. In certain embodiments, the hydrogen ($H_2$) may be between about 1 to 10 percent of the total amount of oxygen ($O_2$) and hydrogen ($H_2$) provided. In certain embodiments, the hydrogen ($H_2$) may be between about 1 to 5 percent, for example, 3 percent of the total amount of oxygen ($O_2$) and hydrogen ($H_2$) provided.

In certain embodiments, the process gas (or gas mixture) may further include water vapor. In certain embodiments where water vapor is provided, the water vapor may be mixed with at least one of hydrogen and/or oxygen gas. Alternatively or in combination, the water vapor may be mixed with at least one inert gas, such as helium (He), argon (Ar), krypton (Kr), neon (Ne), or the like.

In certain embodiments, the gas mixture is exposed to a plasma in order to enhance the radical generation. In certain embodiments, the plasma may be formed by a remote plasma source (RPS). In certain embodiments, the plasma may be formed by an RPS in a separate chamber. In certain embodiments, the plasma may be formed in-situ. In one embodiment, the oxygen and hydrogen may be activated by exposure to RF power. Exposure to RF power ionizes at least a portion of the gas mixture, forming a plasma. RF power at a frequency between about 10 kHz and about 14 MHz may be applied at a power level between about 1,000 W and about 5,000 W to create the plasma. A frequency of 13.56 MHz is commonly used. In one embodiment, the oxygen and hydrogen may be activated by exposure to a microwave source. In one embodiment, the microwave source is a 2.45 GHz microwave source. In certain embodiments, the microwave source is operated at a power level between about 1,000 W and 5,000 Watts, for example, 3,000 Watts.

In certain embodiments, the process gas (or gas mixture) may be provided at total flow rate of between about 10,000 sccm and 50,000 sccm, or at about 30,000 sccm. For example, when both oxygen ($O_2$) and hydrogen ($H_2$) are provided, the oxygen ($O_2$) and hydrogen ($H_2$) may be provided in a total flow rate of between about 10,000 sccm and 50,000 sccm, especially between about 25,000 sccm and 35,000 sccm, or at about 30,000 sccm, in the percentage ranges described above.

In embodiments where water vapor is provided, the water vapor may be introduced at a flow rate of between about 5-1,000 sccm with one or more inert carrier gases. The inert gases may be provided as necessary to provide a total flow rate of between about 100-2,000 sccm and to provide a process gas mixture having up to about 50 percent water vapor. Inert gas additions may also be used with the $H_2/O_2$ mixture to prevent recombination of the ionized oxygen and/or hydrogen.

Figure 4B:
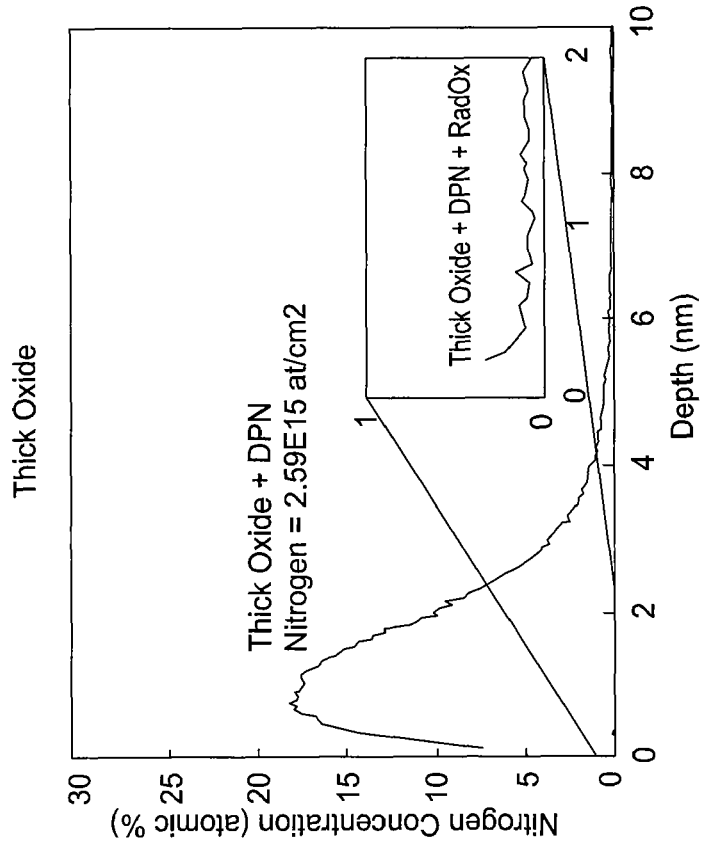
FIG. 4B is a plot depicting a SIMS depth profile of nitrogen in a thick oxide substrate according to embodiments of the present invention.
Figure 4A:
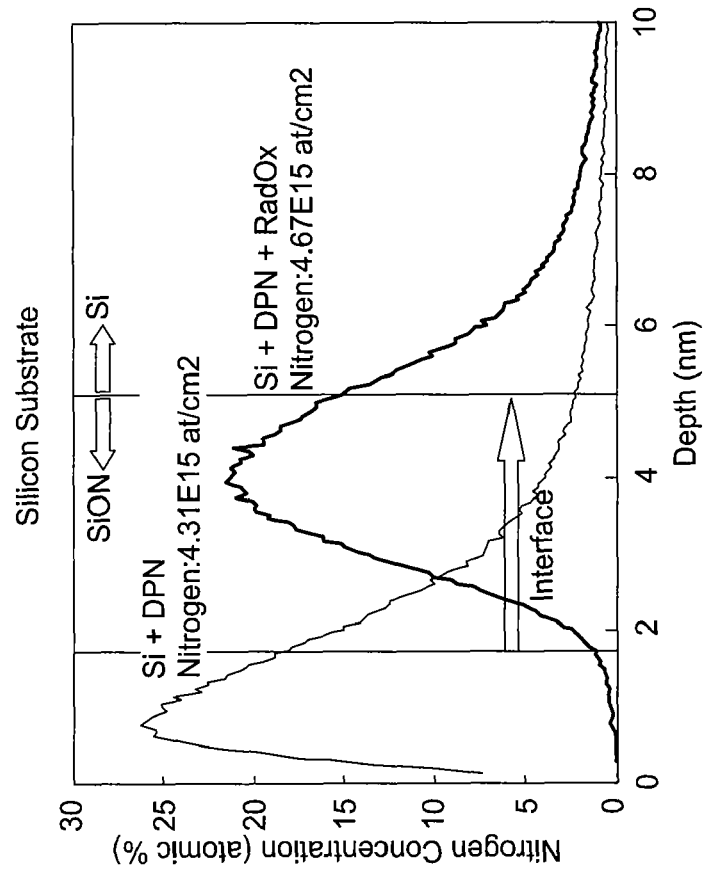
FIG. 4A is a plot depicting a SIMS depth profile of nitrogen in a silicon substrate according to embodiments of the present invention.

FIG. 4A is a plot depicting a SIMS depth profile of nitrogen in a silicon substrate according to embodiments of the present invention. FIG. 4B is a plot depicting a SIMS depth profile of nitrogen in a thick oxide substrate according to embodiments of the present invention. The y-axis represents nitrogen concentration in atomic % and the x-axis represents depth in nanometers. As shown in FIG. 4A, after exposing a silicon substrate to a Decoupled Plasma Nitridation (DPN) process followed by a radical oxidation with hydrogen and oxygen containing gases according to embodiments described herein, nitrogen remains at the silicon/silicon oxynitride interface and SIMS Ndose is conserved. FIG. 4B depicts a comparison of a thick oxide layer after exposure to a DPN process verses a thick oxide layer exposed to a DPN process followed by a radical oxidation process with hydrogen containing gases and oxygen containing gases according to embodiments described herein. As shown in FIG. 4B, after exposure to the radical oxidation process, nitrogen is fully removed from the thick oxide.

Figure 5:
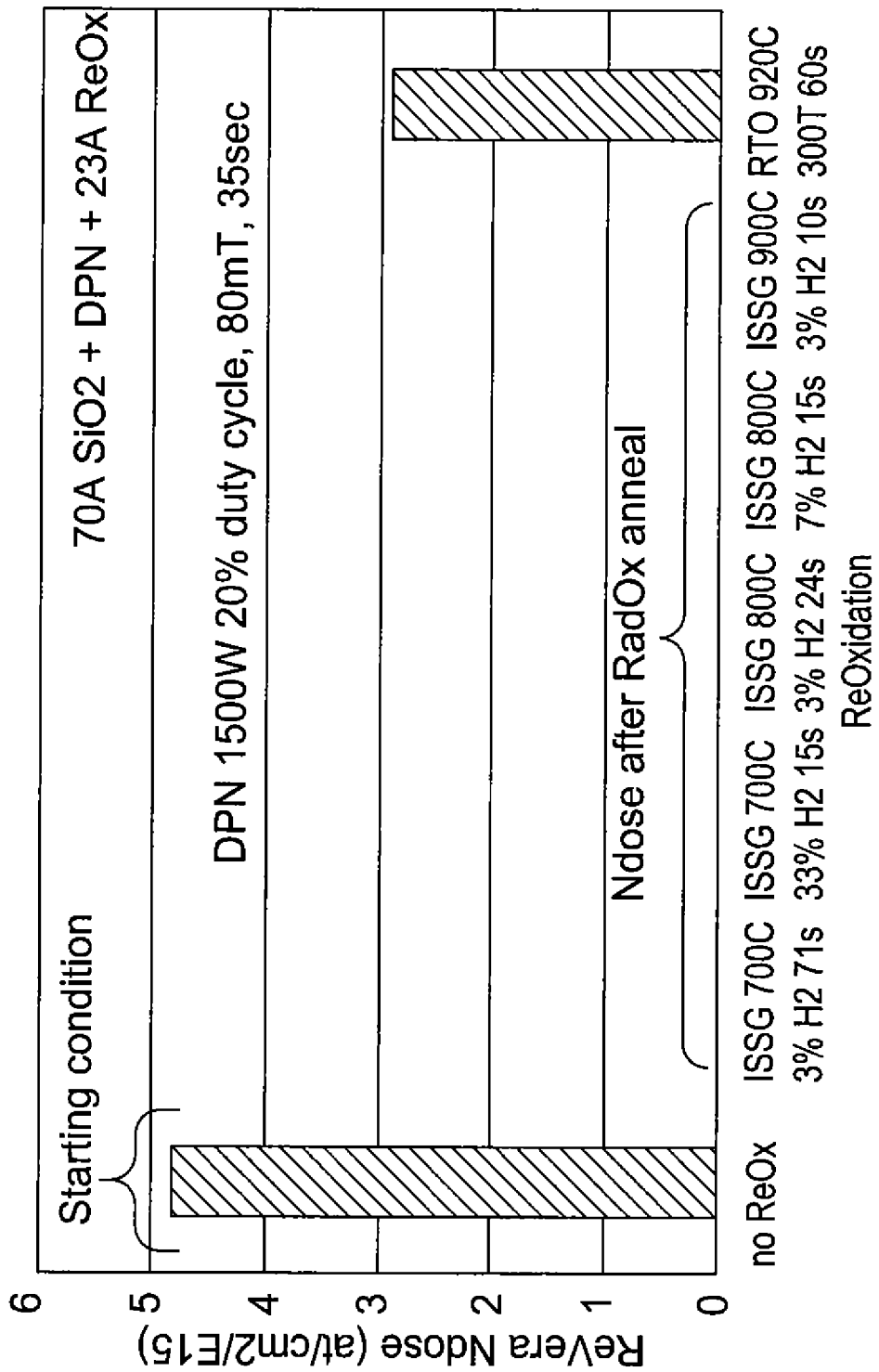
FIG. 5 is a plot depicting the results of X-Ray Photoelectron Spectroscopy (XPS) for nitrogen remaining in silicon oxide after a DPN process compared with a DPN process followed by a radical oxidation process performed according to embodiments of the present invention.

FIG. 5 is a plot depicting the results of X-Ray Photoelectron Spectroscopy (XPS) for nitrogen remaining in silicon oxide after a DPN process compared with a DPN process followed by a radical oxidation process performed according to embodiments of the present invention. The y-axis represents the nitrogen (N)dose ($\times 10^{15}$ N atoms/cm$^2$) on 70 Å of silicon oxide. The x-axis represents various samples of silicon oxide which were exposed to a DPN process (1,500 W, 20% duty cycle, 80 mT, 35 seconds). The first sample was not exposed to a radical oxidation process. Samples 2-6 were exposed to a radical oxidation process or "in-situ steam generation" (ISSG) process after the DPN process. The RadOx process is chosen by adjusting temperature, H %, pressure, to meet the desired nitrogen removal. Sample 7 was exposed to a rapid thermal oxidation (RTO) process after the DPN process. As demonstrated in FIG. 5, a radical oxidation anneal performed after a nitridation process removes nitrogen from silicon oxide over a wide range of process conditions whereas a rapid thermal oxidation process does not.

Figure 6:
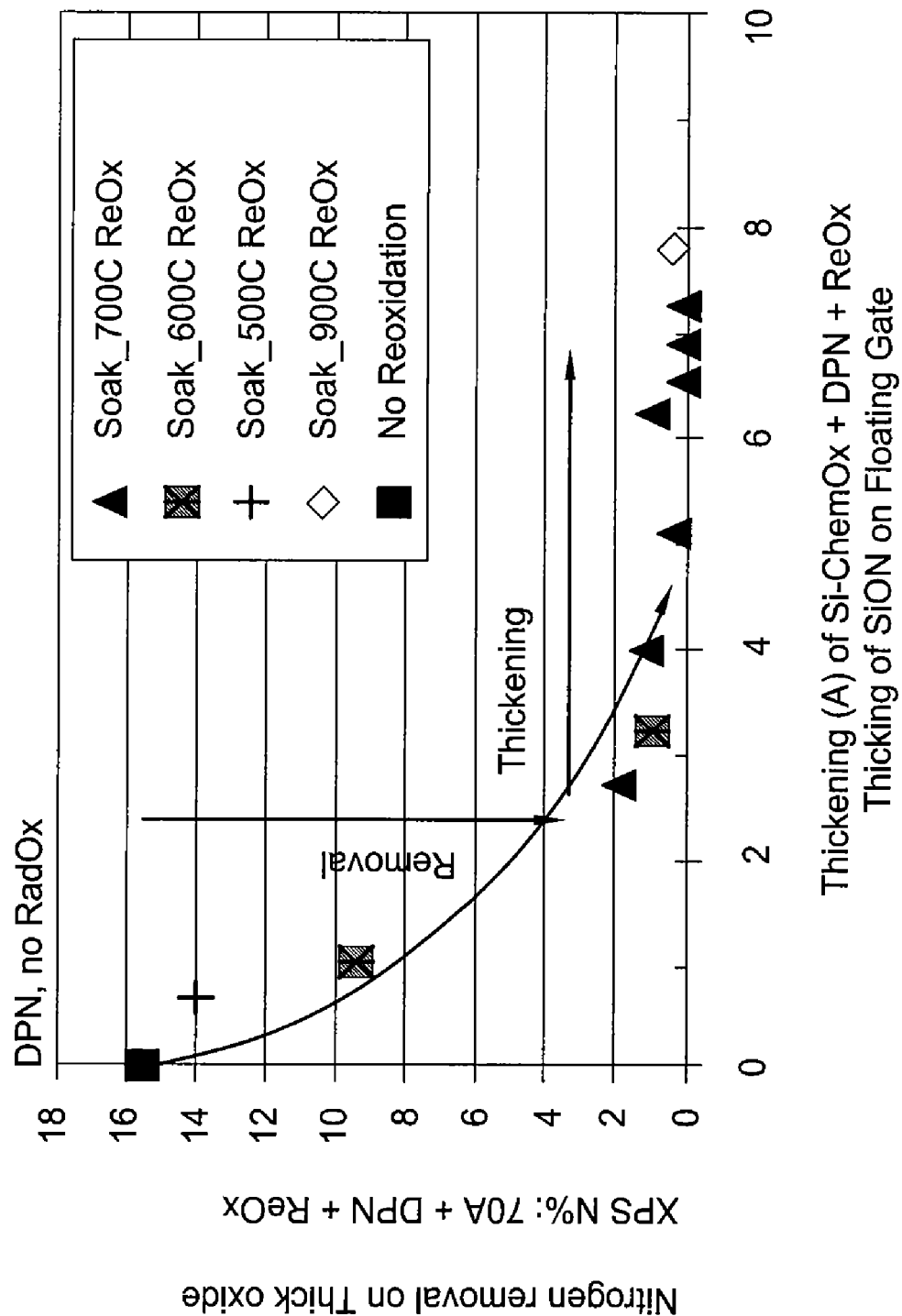
FIG. 6 is a plot depicting nitrogen removal on a thick oxide verses thickening of a silicon oxynitride layer on a floating gate according to embodiments of the present invention.

FIG. 6 is a plot depicting nitrogen removal on a thick oxide verses thickening of a silicon oxynitride layer on a floating gate according to embodiments of the present invention. FIG. 6 demonstrates that as nitrogen is removed from the oxide, additional thickening of the nitrided polysilicon occurs. Additional thickening of the nitrided polysilicon may result in an undesirable increase in the effective inter-poly-dielectric equivalent oxide thickness (EOT). As shown in FIG. 6, over 10 times reduction in nitrogen is achievable within minimal thickening (less than 4 Å) of the silicon oxynitride layer on the floating gate.

By using a radical oxidation process after a nitridation process ("selective removal" sequence), the majority of nitrogen formed on STI SiO$_2$ regions may be removed without significantly changing the nitrogen concentration in the FG polysilicon. When oxidizing the nitrided silicon, the nitrogen remains at the Si interface while allowing some growth of SiO$_2$ above the nitrogen. Therefore a thin SiO$_2$ film with nitrogen at the SiO$_2$/Si interface is formed.

Figure 7:
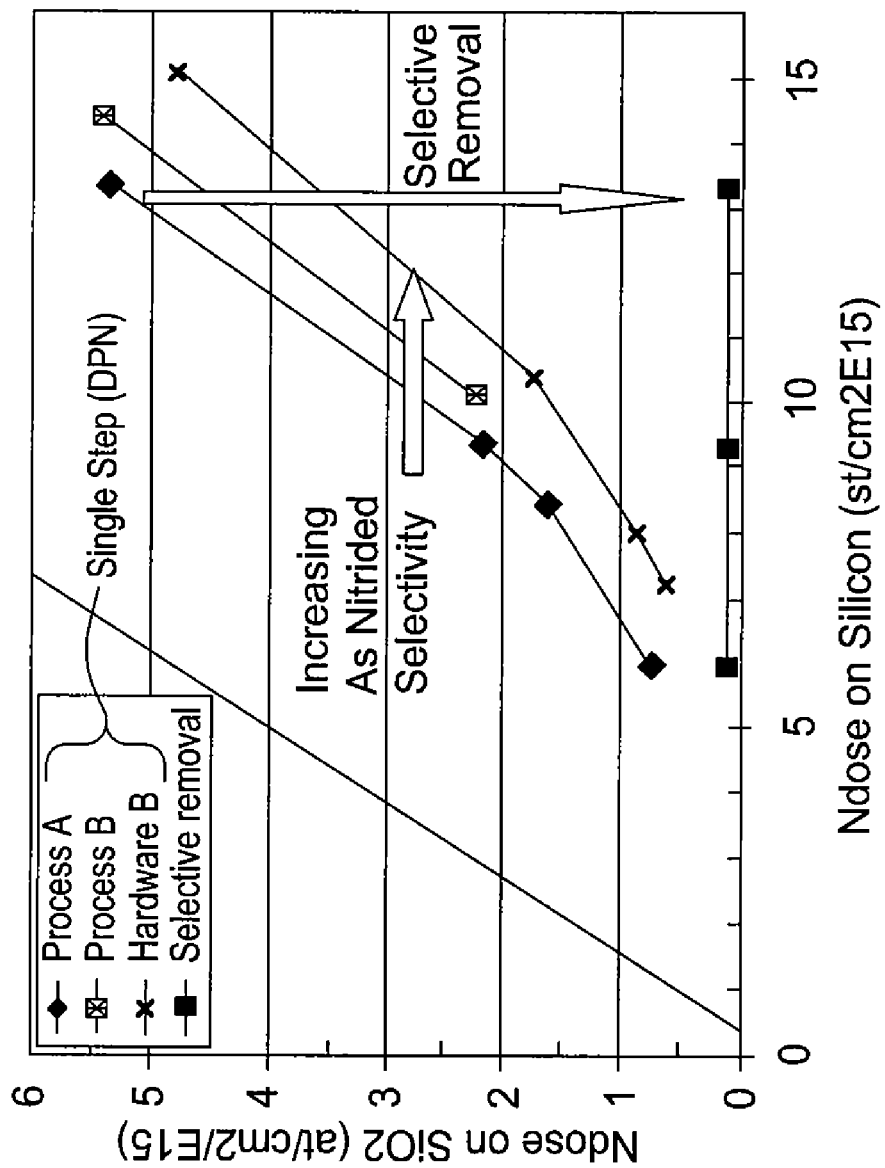
FIG. 7 is a plot depicting comparison of $N_2$ concentration on Si and $SiO_2$ films showing the superiority of the selective removal technique according to embodiments of the present invention.

A comparison of the process results for the two approaches, a single step DPN and DPN followed by radical oxidation as described herein is shown in FIG. 7. FIG. 7 is a plot depicting comparison of N$_2$ concentration on Si and SiO$_2$ films showing the superiority of the selective removal technique according to embodiments of the present invention. Changing processes (A vs. B) or using different chamber hardware (B) can slightly improve the "as-nitrided selectivity" but the selective removal process including nitridation followed by radical oxidation can virtually eliminate nitrogen on the SiO$_2$ without changing the nitrogen in the polysilicon. One consequence of the selective removal approach is the small growth of an oxide film on the Si region. However, by regulating the radical oxidation process conditions this additional thickness growth can be restricted to a few angstroms. Using both nitridation and radical oxidation, a highly selective process sequence can be used to incorporate high levels of nitrogen into the FG poly with very little nitrogen in the STI oxide.

While the foregoing is directed to embodiments of the present invention, other and further embodiments of the invention may be devised without departing from the basic scope thereof, and the scope thereof is determined by the claims that follow.

The invention claimed is:

1. A method for selectively removing nitrogen from the nitrided areas of a substrate, comprising:
    positioning a substrate comprising a material layer disposed adjacent to an oxide containing layer in a processing region;
    exposing the substrate to a nitridation process to incorporate nitrogen onto the material layer and exposed areas of the oxide containing layer; and
    exposing the nitrided material layer and the nitrided areas of the oxide containing layer to a gas mixture comprising a quantity of a hydrogen containing gas and a quantity of an oxygen containing gas to selectively remove nitrogen from the nitrided areas of the oxide containing layer relative to the nitrided material layer using a radical oxidation process.

2. The method of claim 1, wherein the material layer is a polysilicon layer and the oxide containing layer is a silicon oxide layer.

3. The method of claim 1, wherein the nitridation process is selected from a plasma nitridation process and a thermal nitridation process.

4. The method of claim 1, wherein the quantity of hydrogen containing gas is from about 0.5% to about 99% of the total gas mixture.

5. The method of claim 4, wherein the quantity of hydrogen containing gas is from about 0.5% to about 33% of the total gas mixture.

6. The method of claim 1, wherein exposing the nitrided material layer and the nitrided areas of the oxide containing layer to a gas mixture further comprises heating the substrate to a predetermined temperature for a predetermined time causing the hydrogen containing gas and the oxygen containing gas to react inside the processing region and selectively remove nitrogen from the nitrided areas of the oxide containing layer to expose a surface of the oxide containing layer.

7. The method of claim 6, wherein exposing the nitrided material layer and the nitrided areas of the oxide containing layer to a gas mixture further comprises pressurizing the processing region to a pressure from about 0.1 Torr and about 50 Torr.

8. The method of claim 6, wherein the predetermined temperature is between 650° C. and 1,050° C.

9. The method of claim 1, wherein the hydrogen containing gas and the oxygen containing gas are exposed to a remote plasma source prior to introduction into the processing region.

10. The method of claim 1, wherein an oxide containing layer is formed over the material layer during the radical oxidation process.

11. A method for selectively removing nitrogen from the nitrided areas of a substrate, comprising:
    positioning a substrate comprising a polysilicon floating gate disposed on a tunnel oxide layer and a shallow trench isolation region disposed adjacent to the tunnel oxide layer in a processing region;
    exposing the substrate to a nitridation process to incorporate nitrogen onto the polysilicon floating gate and exposed areas of the shallow trench isolation region; and
    exposing the nitrided polysilicon floating gate and the nitrided areas of the shallow trench isolation region to a gas mixture comprising a quantity of a hydrogen containing gas and a quantity of an oxygen containing gas to selectively remove nitrogen from the nitrided areas of the shallow trench isolation region relative to the nitrided polysilicon floating gate using a radical oxidation process.

12. The method of claim 11, further comprising:
depositing an inter-poly dielectric layer atop the floating gate and the shallow trench isolation region; and
depositing a conductive layer over the inter-poly dielectric layer.

13. The method of claim 11, wherein exposing the nitrided polysilicon floating gate and the nitrided areas of the shallow trench isolation region to a gas mixture further comprises heating the substrate to a predetermined temperature for a predetermined time causing the hydrogen containing gas and the oxygen containing gas to react inside the processing region and selectively remove nitrogen from the nitrided areas of the shallow trench isolation region to expose a surface of the shallow trench isolation region.

14. The method of claim 13, wherein exposing the nitrided material layer and the nitrided areas of the oxide containing layer to a gas mixture further comprises pressurizing the processing region to a pressure from about 2 Torr and about 20 Torr.

15. The method of claim 14, wherein the predetermined temperature is between 500° C. and 1,200° C.

16. The method of claim 15, wherein the predetermined temperature is between 650° C. and 1,050° C.

17. The method of claim 16, wherein the quantity of hydrogen containing gas is about 0.5% to about 33% of the total gas mixture.

18. The method of claim 11, wherein the gas mixture further comprises a non-reactive gas selected from one or more of nitrogen gas ($N_2$), helium (He), argon (Ar), neon (Ne), and xenon (Xe).

19. The method of claim 11, wherein the hydrogen containing gas and the oxygen containing gas are exposed to a remote plasma source prior to exposing the nitrided polysilicon floating gate and the nitrided areas of the shallow trench isolation region.

20. The method of claim 11, wherein an oxide containing layer is formed over the nitrided polysilicon floating gate during the radical oxidation process.

* * * * *

UNITED STATES PATENT AND TRADEMARK OFFICE
CERTIFICATE OF CORRECTION

| | | |
|---|---|---|
| PATENT NO. | : 8,163,626 B2 | Page 1 of 1 |
| APPLICATION NO. | : 12/815659 | |
| DATED | : April 24, 2012 | |
| INVENTOR(S) | : Swenberg et al. | |

It is certified that error appears in the above-identified patent and that said Letters Patent is hereby corrected as shown below:

Title Page, Inventors (75):

Please delete "Swenburg" and insert --Swenberg-- therefor.

Signed and Sealed this
Fourteenth Day of August, 2012

David J. Kappos
*Director of the United States Patent and Trademark Office*